United States Patent [19]

Matlock et al.

[11] Patent Number: 4,702,000
[45] Date of Patent: Oct. 27, 1987

[54] TECHNIQUE FOR ELIMINATION OF POLYSILICON STRINGERS IN DIRECT MOAT FIELD OXIDE STRUCTURE

[75] Inventors: Dyer A. Matlock, Melbourne; Richard L. Lichtel, Jr.; Lawrence G. Pearce, both of Palm Bay, all of Fla.

[73] Assignee: Harris Corporation, Melbourne, Fla.

[21] Appl. No.: 841,297

[22] Filed: Mar. 19, 1986

[51] Int. Cl.$^4$ .................... H01L 21/265; H01L 21/22
[52] U.S. Cl. .............................. 437/63; 148/DIG. 50; 148/DIG. 86; 148/DIG. 122; 148/DIG. 131; 156/640; 156/643; 156/651; 156/644; 357/23.11; 357/23.9; 357/49; 357/59; 437/186; 437/233
[58] Field of Search .................... 29/576 W, 511, 578, 29/590; 148/DIG. 50, DIG. 51, DIG. 53, DIG. 86, DIG. 122, DIG. 131, DIG. 187; 156/640, 651, 643, 644; 357/23.11, 23.9, 49, 59 E, 59 G

[56] References Cited

U.S. PATENT DOCUMENTS

| | | | |
|---|---|---|---|
| 4,354,897 | 10/1982 | Nakajima | 156/643 |
| 4,356,040 | 10/1982 | Fu et al. | 148/1.5 |
| 4,356,623 | 11/1982 | Hunter | 29/571 |
| 4,371,403 | 2/1983 | Ikubo et al. | 148/1.5 |
| 4,373,965 | 2/1983 | Smigelski | 148/1.5 |
| 4,433,468 | 2/1984 | Kawamata | 29/571 |
| 4,435,896 | 3/1984 | Parillo et al. | 29/571 |
| 4,439,270 | 3/1984 | Powell et al. | 156/644 |
| 4,512,073 | 4/1985 | Hsa | 29/571 |
| 4,536,943 | 8/1985 | Kakuma | 29/571 |
| 4,546,534 | 10/1985 | Nicholas | 29/571 |

FOREIGN PATENT DOCUMENTS

| | | | |
|---|---|---|---|
| 0087666 | 7/1981 | Japan | 156/644 |
| 0036866 | 2/1982 | Japan | 156/644 |
| 0055665 | 3/1985 | Japan | 29/578 |

OTHER PUBLICATIONS

Karl L. Wang et al., "Direct Moat Isolation for VLSI", IEEE Trans. Electr. Dev., vol. ED-29, No. 4, Apr. 1982, pp. 541-547.
C. B. Zarowin, "Plasma Etch Anisotropy-. . .", J. Electrochem. Soc., vol. 130, No. 5, May 1983, pp. 1144-1152.

Primary Examiner—Brian E. Hearn
Assistant Examiner—William Bunch
Attorney, Agent, or Firm—Antonelli, Terry & Wands

[57] ABSTRACT

The problem of unwanted residual polysilicon stringers along the sidewalls of a field oxide layer employed in direct moat wafer processing is avoided by a processing scheme in which the sidewalls of the aperture in the field oxide layer are initially tapered prior to formation of the polysilicon layer to be used for the gate electrode(s). Because of the graduated thickness of the sidewalls of the field oxide layer, the thickness of the polysilicon layer formed thereon is substantially uniform over the entirety of the substrate. As a result, during subsequent masking of the polysilicon layer to define the gate electrode(s), all unmasked portions of the polysilicon are completely etched, leaving no residual material (e.g. stringers) that could be a source of device contamination. After the polysilicon gate has been delineated, the sloped sidewalls of the field oxide are removed (by anisotropic etching), so that the sidewalls of the apertures or windows of the field oxide layer will be perpendicular to the planar surface of the substrate, thus facilitating proper formation of dielectric (oxide) spacers therealong, which thereby provide separation between contact materials and the junction created by shallow ion implantation of dopants through the field oxide aperture.

18 Claims, 20 Drawing Figures

TECHNIQUE FOR ELIMINATION OF POLYSILICON STRINGERS IN DIRECT MOAT FIELD OXIDE STRUCTURE

FIELD OF THE INVENTION

The present invention relates in general to the manufacture of semiconductor devices and, in particular, to a technique for preventing the formation of polysilicon stringers adjacent to the sidewalls of the aperture in a direct moat field oxide layer, through which oxide layer regions of a field effect device are formed and whereat insulative spacers, for providing sufficient separation between contacting materials such as selectively deposited metal (tungsten) and the junction created by shallow ion implantation of dopants through the field oxide aperture, are provided.

BACKGROUND OF THE INVENTION

The surface configuration of an integrated circuit device, particularly one employing silicon as the bulk material of the substrate wherein device regions are formed, will vary depending upon the type of surface passivation processing employed. For example, recess or trench-processed substrates and LOCOS (local oxidation of silicon) -formed structures have an undulating surface configuration, while devices formed using direct moat processing techniques are effectively planar-surfaced. Because of the variations in thickness of field insulator material or change in surface shape of the bulk of an integrated circuit device manufactured using the former two techniques, integration density and immunity to external influences (e.g. radiation hardness) of the resulting structures are reduced compared with a planar-surfaced structure formed by direct moat (e.g. via a field oxide) processing. For a discussion of the above-referenced techniques and their effects on integrated circuit manufacture, attention may be directed to an article by K. L. Wang et al entitled "Direct Moat Isolation for VLSI", published by the IEEE in IEDM 81, pages 372-375.

As described in the Wang et al article, direct moat wafer processing has recently been recognized as offering a number of advantages over previous methodologies for processing large scale integrated circuits. In the manufacture of circuits containing field effect devices, the field oxide that is formed on the planar surface of the substrate and used to prevent the creation of unwanted parasitic devices beneath overlying interconnect material (e.g. metal, polysilicon), has formed therein apertures or windows through which dopants for forming device regions are introduced, and within which gate electrodes (e.g. polysilicon) are provided.

An illustration of an exemplary embodiment of an apertured field oxide layer for forming a field effect device in a semiconductor (e.g. silicon) substrate using direct moat processing is shown in FIGS. 1-8, of which FIGS. 1, 3, 4 are plan views of the device, while FIGS. 2, 5, 6 are sectional views taken along line A-A' of FIGS. 1, 3, 4, respectively. FIG. 7 is a sectional view taken along line B-B' of FIG. 4, while FIG. 8 is a sectional view taken along C-C' of FIG. 4. As shown in FIGS. 1 and 2, a (silicon) substrate 10 having a planar surface 11 has a field oxide layer 12 formed thereon (typically to a thickness on the order of 5000-6000Å). Field oxide layer 12 has an aperture or window 13 formed therein exposing a surface region 14 of the planar surface 11 of substrate 10. The sidewalls 15 of window 13 are effectively perpendicular to planar surface 11, so as to allow subsequent formation of an insulative spacer thereat.

Next, as illustrated in FIGS. 3 and 5, following the formation of a thin dielectric (gate oxide) layer 21 (having a thickness on the order of 100-400Å), gate electrode material (e.g. polysilicon) 25 is nonselectively formed on the top surface 16 of the field oxide layer 12 and on the gate oxide layer 21 within the entirety of the aperture 13. The layer 25 of polysilicon gate material is selectively etched to form a gate electrode 26 which, as shown in FIGS. 4 and 6, overlies the top surface 16 of field oxide layer 12 and extends onto thin gate oxide layer 21. During this step, that portion of the polysilicon layer 25 whereat the gate electrode 26 is to be formed is masked and the exposed polysilicon material is reactive ion etched, so as remove the polysilicon layer in a direction normal to the surface 11 of substrate 10 down to the surface of field oxide 12 and substrate surface 11, partly removing exposed surface portions of the thin gate oxide layer 21 adjacent to the masked polysilicon gate 26 and the field oxide layer 12. Complete removal of the gate oxide 21 results in etching of the substrate 10 and results in device damage. This constraint limits the etch of the polysilicon.

More particularly, the etch of the polysilicon proceeds uneventfully until a thickness t in FIG. 5 is removed. At that point the gate oxide 21 becomes exposed to the etch environment in those regions away from the field oxide edge 15. Once exposed the gate oxide begins to etch. Should all of the gate oxide be etched away, the etch will proceed into the silicon substrate and destroy the device. Stopping the etch before this occurs will, for typical values of gate and field oxides, leave some of the polysilicon having thickness T around the oxide wall. This residual is an unwanted polysilicon stringer 30. Thus the stringer results from two compounding effects. First, the field oxide wall creates wall of polysilicon with thickness T greater than the flat film thickness t. Second, the etch is limited in extent by the penetration of the gate oxide under the thinner polysilicon.

SUMMARY OF THE INVENTION

In accordance with the present invention the problem of unwanted residual polysilicon stringers along the sidewalls of a field oxide layer employed in direct moat wafer processing is avoided by a processing scheme in which the sidewalls of the aperture in the field oxide layer are initially sloped prior to formation of the polysilicon layer to be used for the gate electrode(s). Because of the graduated thickness of the sidewalls of the field oxide layer, the thickness of the polysilicon layer formed thereon is substantially uniform over the entirety of the substrate. As a result, during subsequent masking of the polysilicon layer to define the gate electrode(s), all unmasked portions of the polysilicon are completely etched, leaving no residual material (e.g. stringers) that could be a source of device contamination. After the polysilicon gate has been delineated, the sloped sidewalls of the field oxide are removed (by anisotropic etching), so that the sidewalls of the apertures or windows of the field oxide layer will be perpendicular to the planar surface of the substrate, thus facilitating proper formation of dielectric (oxide) spacers therealong, which thereby provide the above-mentioned separation between contact materials and the junction created by shallow ion implantation of dopants through the field oxide aperture.

DETAILED DESCRIPTION

Figure 1:
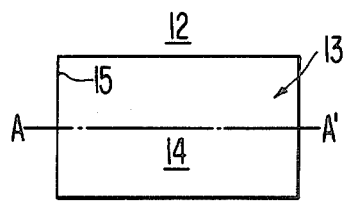
FIG. 1 is a plan view of a semiconductor structure having a conventional vertical sidewall-apertured field oxide layer to be employed in direct moat wafer processing.
Figure 2:
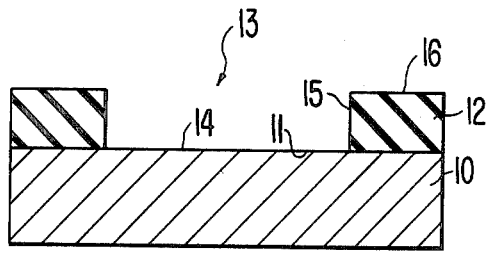
FIG. 2 is a sectional view of the semiconductor structure of FIG. 1 taken along line A-A' thereof.
Figure 3:
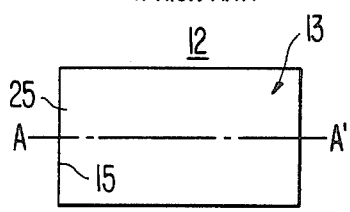
FIG. 3 is a plan view of the semiconductor structure of FIG. 1 having a layer of polysilicon thereon.
Figure 4:
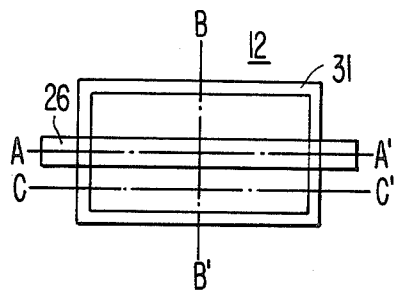
FIG. 4 is a plan view of the semiconductor structure of FIG. 3 that has been selectively etched to form a polysilicon gate electrode.
Figure 5:
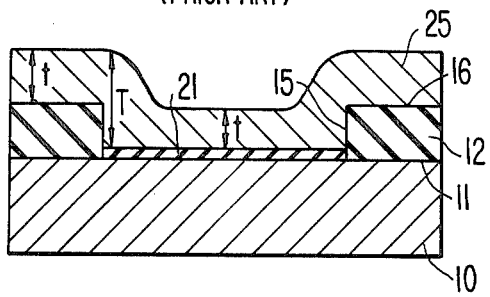
FIG. 5 is a sectional view of the semiconductor structure of FIG. 3 taken along line A-A' thereof.
Figure 6:
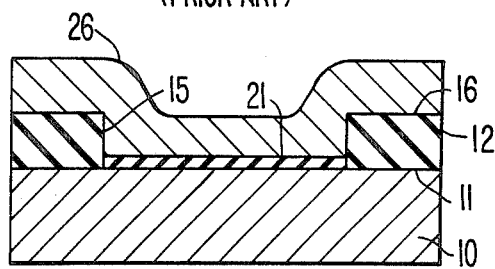
FIGS. 6, 7 and 8 are sectional views of the semiconductor structure of FIG. 4 taken along lines A-A', B-B' and C-C', thereof, respectively.
Figure 7:
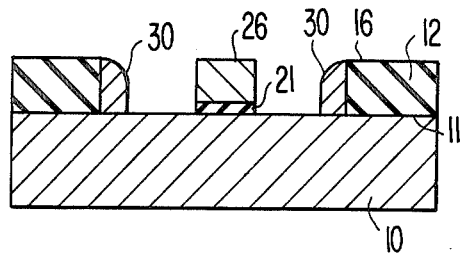
Figure 8:
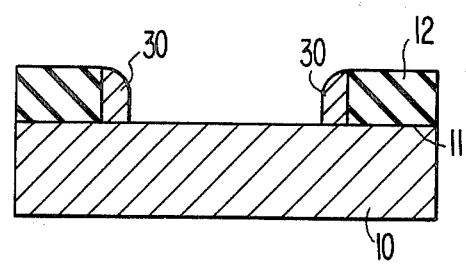
Figure 9:
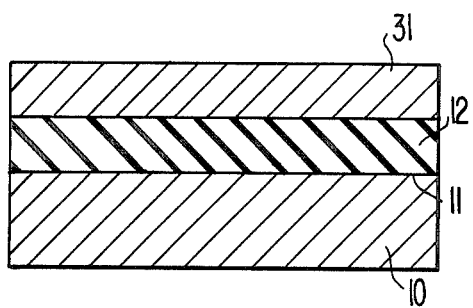
FIG. 9 is a diagrammatic side view of a substrate having successive field oxide and photoresist masking layers formed thereon.
Figure 10:
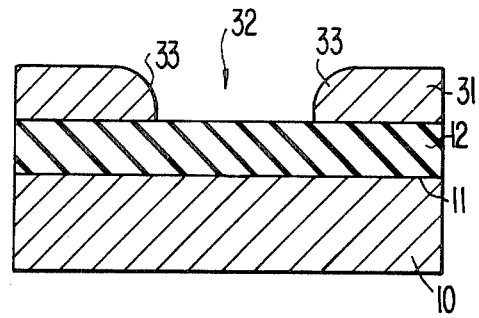
FIG. 10 shows the structure of FIG. 9 wherein the photoresist layer has a graduated-wall aperture therethrough.

Referring now to FIGS. 9-20, the processing steps for selectively forming a polysilicon gate electrode in the aperture of a field oxide layer without unwanted polysilicon stringers will be described. Initially, as shown in FIG. 9, a photoresist layer 31 is formed atop the field oxide layer 12 which has been formed on the surface 11 of a planar substrate 10. An aperture 32 is selectively formed in the photoresist layer 31, by the combined effects of exposure and development on the photoresist layer or by flowing the photoresist after a patterning step to produce a mask in which the sidewalls 33 of the aperture in the photoresist layer 31 are rounded, namely graduated. This graduated slope of the sidewalls of the aperture in photoresist layer 31 is then transferred to the field oxide layer 12 therebeneath using a low selectivity etch such as $CF_4+O_2$, which provides a 1:1 etch rate of photoresist to oxide. Modification of the 1:1 etch rate may be accomplished by adjusting the amount of oxygen, in accordance with conventional plasma etching techniques.

Figure 11:
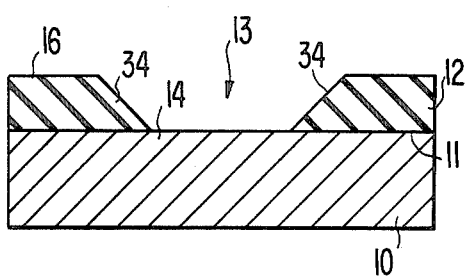
FIG. 11 shows a field oxide layer disposed on a substrate processed using the photoresist structure of FIG. 10.
Figure 12:
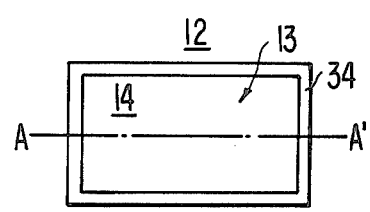
FIG. 12 shows a plan view of the structure of FIG. 11 with lines A-A' delineating the cross-section to which FIG. 11 corresponds.
Figure 13:
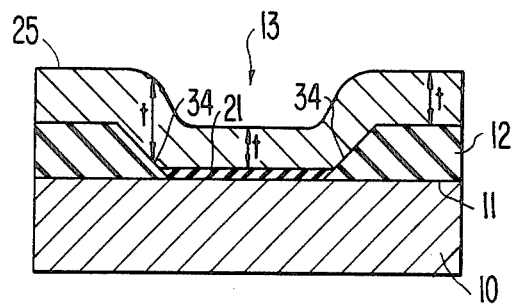
FIG. 13 shows the structure of FIG. 11 whereon a polysilicon layer has been nonselectively formed.

The resulting configuration is shown in FIG. 11 wherein the field oxide layer 12 has a sloped sidewall portion 34 extending from the exposed surface 14 of substrate surface 11 within aperture 13 to the top surface 16 of the field oxide layer 12.

Following the formation of the sloped sidewall aperture 13 in the field oxide layer 12, a thin gate oxide layer 21 is deposited on the exposed portion 14 of the substrate surface 11. Thereafter, a polysilicon layer is nonselectively and conformally deposited over the entire surface of the semiconductor structure, resulting in the formation of an effectively uniformally thick layer 25, shown in FIG. 13. As illustrated therein, because of the graduated or sloped sidewall 34 of the window 13 formed in the field oxide layer 12, the thickness t of the polysilicon layer 25 is substantially the same on both the top surface 16 of the field oxide 12, the thin gate oxide layer 21 and the sloped sidewall portions 34 of the field oxide layer 12.

Figure 14:
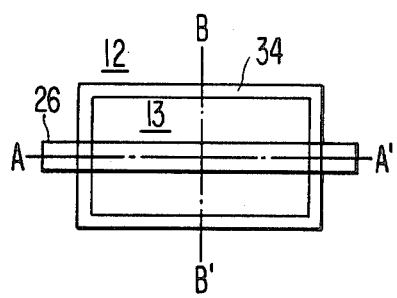
FIG. 14 is a plan view of the semiconductor structure of FIG. 13 in which the polysilicon layer has been selectively etched to form a polysilicon gate electrode.
Figure 15:
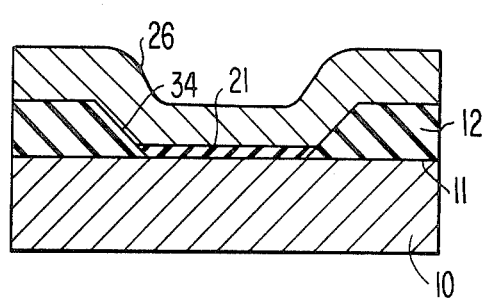
FIG. 15 is a sectional view of the structure of FIG. 14 taken along line A-A' thereof.
Figure 16:
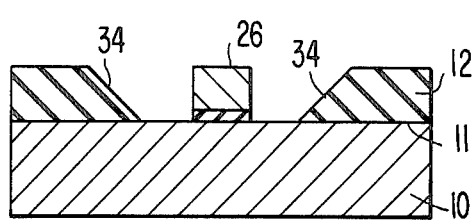
FIG. 16 is a sectional view of the semiconductor structure of FIG. 14 taken along line B-B' thereof.

Next, polysilicon layer 25 is selectively etched, to form a narrow polysilicon gate electrode 26, a plan view of which is shown in FIG. 14 and respective sectional views of which are shown in FIGS. 15 and 16, respectively. As shown in FIG. 16, where unmasked, namely at areas of the structure other than where the gate electrode is to be formed, the polysilicon material of layer 25 has been completely removed. This includes the entirety of layer 25 formed on the sloped surface portions 34 of the field oxide layer 12. As a result, there is no residual continuous segment of polysilicon along the border of the opening 13 in the sloped sidewall field oxide layer 12. During this etching step that portion of thin gate oxide layer 21, other than where the polysilicon gate layer is to remain, acts as a sacrificial oxide layer to further protect the planar surface 11 of substrate 10 therebeneath.

Figure 17:
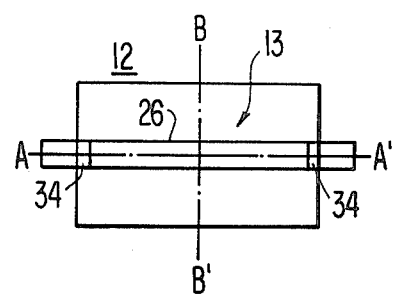
FIG. 17 is a plan view of the semiconductor structure of FIG. 14 that has been subjected to etching of the field oxide to remove the sloped sidewall portion thereof; is a sectional view of the structure of FIG. 17 taken along line A-A' thereof.
Figure 18:
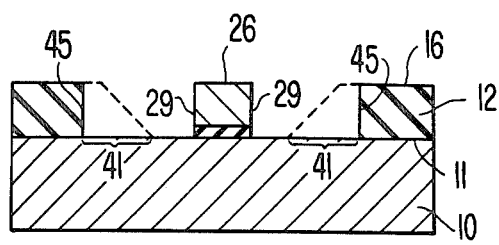
FIG. 18 is a sectional view of the structure of FIG. 17 taken along line A-A' thereof.

Next, as shown in FIGS. 17 and 18, the field oxide layer 12 is subjected to a selective etch, using an oversized mask pattern to remove the sloped sidewall portions 34. To carry out this anisotropic etch of the field oxide layer 12, a reactive ion etch may be employed. This etching step effectively transforms the sidewalls of the aperture 13 in the field oxide layer 12 from a sloped configuration (at 34) to a vertical configuration (at 45, effectively perpendicular to surface 11), exposing an area 41 of surface 1 adjacent to the vertical walls 45 thereof, as shown in FIG. 18. The thin gate oxide layer 21 beneath the polysilicon gate 26 is protected by the polysilicon material during the step and is, accordingly, not etched. The configuration of the polysilicon gate electrode is unaffected during this etch step, so that it remains effectively as shown in FIG. 15, which corresponds to a sectional view of the structure shown in FIG. 17, taken along line A-A' thereof.

Figure 19:
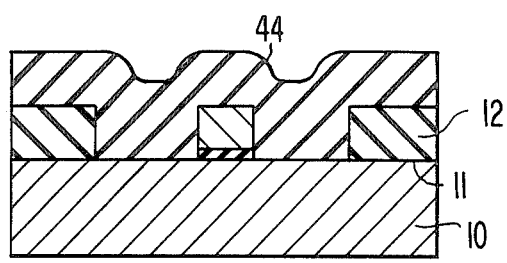
FIG. 19 shows the structure of FIG. 18 whereon a further oxide layer has been non-selectively formed.
Figure 20:
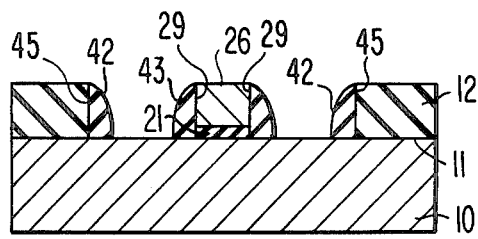
FIG. 20 shows the structure of FIG. 19 that has been selectively etched to leave oxide spacers adjacent to the sidewalls of the apertured field oxide and polysilicon gate.

After removal of the sloped sidewalls 34 and the introduction of dopants for the formation of source/drain regions adjacent to polysilicon gate 26, oxide spacers may be selectively formed over those portions of the apertured surface of the substrate 10, delineated by the vertical sidewalls 45 of the field oxide 12 and the vertical sidewalls 29 of the polysilicon gate electrode 26. For this purpose, as shown in FIG. 19, a further layer of silicon dioxide 44 may be non-selectively and conformally deposited (as by chemical vapor deposition) over the entirety of the structure shown in FIG. 18. Oxide layer 44. is then anisotropically etched (e.g. by reactive ion etching) to leave spacers 42, 43 adjacent to the vertical sidewalls 45 of field oxide layer 12 and the vertical sidewalls 29 of polysilicon gate 26, as shown in FIG. 20. By the formation of such oxide spacers, improved source/drain metallization contact is afforded. Moreover, such oxide spacers may be employed to selectively tailor the dopant concentration of those portions of the source/drain regions adjacent the field oxide and the polysilicon gate.

As will be appreciated from the foregoing description, the present invention offers a scheme for eliminating the problem of polysilicon stringers that are formed during the selective etching of polysilicon material employed as the gate electrode in a direct moat processed field effect integrated circuit structure. Because the sidewalls of the aperture in field oxide layer are tapered or sloped, the deposited polysilicon is of substantially uniform thickness over the entire structure. As a result, during subsequent selective etching of the polysilicon layer, the entirety of the unmasked portion of the polysilicon is removed, i.e. no unwanted stringers remain.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. A method of manufacturing a semiconductor device comprising the steps of:
   (a) selectively forming an insulator layer on a planar surface of a semiconductor substrate so as to expose a portion of said planar surface through an aperture in said insulator layer, the thickness of said insulator layer adjacent to said aperture being tapered to the exposed surface of said substrate;
   (b) forming a layer of conductive material over the structure formed by step (a);
   (c) selectively removing the layer of conductive material formed in step (b) so as to expose the surface of said insulator layer and said portion of said planar surface except for a preselected region of said portion of said planar surface over which a preselected portion of said layer of conductive material remains; and
   (d) removing material from the tapered thickness portion of said insulator layer adjacent to said aperture therein so as to effectively increase the slope of the sidewalls of said insulator.

2. A method according to claim 1, wherein step (d) comprises removing a portion of said insulator layer adjacent to said aperture therein including said tapered thickness portion thereof such that a newly defined aperture in said insulator layer has vertical sidewalls effectively perpendicular to the planar surface of said substrate.

3. A method according to claim 1, further comprising the step of:
   (e) selectively forming insulator spacers on the exposed surface of said substrate, so as to be contiguous with said insulator layer and said preselected remaining portion of said layer of conductive material.

4. A method according to claim 2, further comprising the step of:
   (e) selectively forming insulator spacers on the surface of said substrate exposed by said newly defined aperture so as to be contiguous with the vertical sidewalls of said insulator layer and sidewalls of said preselected remaining portion of said layer of conductive material.

5. A method according to claim 2, further including the step of:
   prior to step (b), forming a thin dielectric layer on said exposed portion of said substrate, such that said layer of conductive material formed in step (b) is formed on said thin dielectric layer.

6. A method according to claim 5, further comprising the step of:
   (e) selectively forming insulator spacers on the exposed surface of said substrate, so as to be contiguous with said insulator layer and said preselected remaining portion of said layer of conductive material.

7. A method according to claim 5, wherein step (c) includes removing that portion of said thin dielectric layer beneath said selectively removed layer of conductive material.

8. A method according to claim 1, wherein said insulator layer comprises a field oxide layer and said layer of conductive material comprises a layer of polysilicon.

9. A method according to claim 1, wherein step (c) comprises anisotropically etching said layer of conductive material so that said preselected portion of said layer of conductive material remaining on said substrate has vertical sidewalls facing the exposed tapered thickness portion of said insulator layer.

10. A method according to claim 1, further comprising, prior to step (d), the step of forming a sacrificial layer on the exposed surface of said substrate, so that, during step (d), removal of said conductive layer leaves the surface of said substrate effectively planar.

11. For use in a direct moat process for manufacturing a semiconductor device wherein a layer of conductive material, that has been non-selectively formed over the surface of a semiconductor structure which comprises a semiconductor body having a planar surface and a field insulator layer disposed therein having an aperture therein exposing a portion of the planar surface of said semiconductor body, is selectively exposed to an etchant for removing selected portions of said layer of conductive material so as to leave a portion thereof extending from the surface of said field insulator layer into said aperture and overlying a portion of the exposed planar surface of said semiconductor body, a method of preventing the formation of residual stringers of said conductive material along the side walls of field insulator layer as a result of the etching of said layer of conductive material comprising the steps of:
   (a) tapering the sidewalls of said aperture in said field insulator layer through which said planar surface of said semiconductor body is exposed;
   (b) non-selectively forming said layer of conductive material over the structure formed by step (a);
   (c) exposing selected surface regions of said layer of conductive material to an etchant, whereby said layer of conductive material is etched to the tapered sidewalls of said field insulator layer and to the planar surface of said semiconductor body; and (d) removing material from the tapered sidewalls of said field insulator layer so as to effectively increase the slope of the sidewalls of said field insulator layer.

12. A method according to claim 11, further comprising, prior to step (c), the step of forming a sacrificial layer on the exposed surface of said semiconductor body, so that, during step (c), etching of said conductive layer leaves the surface of said substrate effectively planar.

13. For use in a direct moat process for manufacturing a semiconductor device wherein a layer of conductive material, that has been non-selectively formed over the surface of a semicondutor structure which comprises a semiconductor body having a planar surface and a field insulator layer disposed therein having an aperture therein exposing a portion of the planar surface of said semiconductor body, is selectively exposed to an etchant for removing selected portions of said layer of conductive material so as to leave a portion thereof extending from the surface of said field insulator layer into said aperture and overlying a portion of the exposed planar surface of said semiconductor body, a method of preventing the formation of residual stringers of said conductive material along the side walls of field insulator layer as a result of the etching of said layer of conductive material comprising the steps of:

(a) tapering the sidewalls of said aperture in said field insulator layer through which said planar surface of said semiconductor body is exposed;

(b) non-selectively forming said layer of conductive material over the structure formed by step (a);

(c) exposing selected surface regions of said layer of conductive material to an etchant, whereby said layer of conductive material is etched to the tapered sidewalls of said field insulator layer and to the planar surface of said semiconductor body; and (d) removing a portion of said field insulator layer adjacent to said aperture therein including the tapered sidewall portion thereof such that a newly defined aperture in said field insulator layer has vertical sidewalls effectively perpendicular to the planar surface of the semiconductor body.

14. A method according to claim 13, further including the step of:

(e) selectively forming insulator spacers on the surface of said semiconductor body exposed by said newly defined aperture so as to be contiguous with the vertical sidewalls of said field insulator layer and sidewalls of the unetched layer of conductive material.

15. A method according to claim 14, further including the step of:

(f) prior to step (b), forming a thin dielectric layer on said exposed portion of said semiconductor body, such that said layer of conductive material formed in step (b) is formed on said thin dielectric layer.

16. A method according to claim 15, wherein step (c) includes etching that portion of said thin dielectric layer beneath the selectively etched portion of said layer of conductive material.

17. A method according to claim 16, wherein said field insulator layer comprises a field oxide layer and said layer of conductive material comprises a layer of polysilicon.

18. A method according to claim 13, further comprising, prior to step (c), the step of forming a sacrificial layer on the exposed surface of said semiconductor body, so that, during step (c), etching of said conductive layer leaves the surface of said substrate effectively planar.

* * * * *